(12) United States Patent
Kainuma et al.

(10) Patent No.: US 10,216,891 B2
(45) Date of Patent: Feb. 26, 2019

(54) METHOD AND APPARATUS FOR SUPPORTING DESIGN IMPROVEMENT WORK OF MECHANICAL APPARATUS

(71) Applicant: FUJI MACHINE MFG. CO., LTD., Chiryu (JP)

(72) Inventors: Makoto Kainuma, Nagoya (JP); Masatoshi Fujita, Anjyo (JP); Ryo Nagata, Okazaki (JP); Takashi Kido, Kariya (JP)

(73) Assignee: FUJI CORPORATION, Chiryu (JP)

( * ) Notice: Subject to any disclaimer, the term of this patent is extended or adjusted under 35 U.S.C. 154(b) by 213 days.

(21) Appl. No.: 15/035,403

(22) PCT Filed: Nov. 26, 2013

(86) PCT No.: PCT/JP2013/081800
§ 371 (c)(1),
(2) Date: May 9, 2016

(87) PCT Pub. No.: WO2015/079499
PCT Pub. Date: Jun. 4, 2015

(65) Prior Publication Data
US 2016/0292349 A1 Oct. 6, 2016

(51) Int. Cl.
*G06F 17/50* (2006.01)
*G05B 19/401* (2006.01)

(52) U.S. Cl.
CPC ....... *G06F 17/5086* (2013.01); *G05B 19/401* (2013.01); *G05B 2219/37344* (2013.01);
(Continued)

(58) Field of Classification Search
CPC .......................... G06F 17/5086; G05B 19/401
(Continued)

(56) References Cited

U.S. PATENT DOCUMENTS 4,623,971 A * 11/1986 Ailman .............. G05B 19/4103
318/561
4,635,206 A * 1/1987 Bhatia .................. G05B 19/371
219/125.12
(Continued)

FOREIGN PATENT DOCUMENTS

DE 101 21 403 A1 11/2002
EP 2 565 447 A1 3/2013
(Continued)

OTHER PUBLICATIONS

Vukosavic et al. ("Suppression of Torsional Oscillations in a High-Performance Speed Servo Drive", IEEE, 1998, pp. 108-117).*
(Continued)

*Primary Examiner* — Kamini S Shah
*Assistant Examiner* — Iftekhar A Khan
(74) *Attorney, Agent, or Firm* — Oblon, McClelland, Maier & Neustadt, L.L.P.

(57) ABSTRACT

There is provided a method for supporting work of improving the design of a mechanical apparatus which is operated by a motor, including: an operating step of operating a movable section of the mechanical apparatus by the motor; a measuring step of obtaining at least one index which indicates an input into the motor or an output from the motor in the operating step; a determining step of determining the mechanical properties of the mechanical apparatus, by using at least one index obtained in the measuring step; and a specifying step of specifying at least one improvement-required item which is required to be improved in the design of the mechanical apparatus, by using the mechanical properties determined in the determining step.

12 Claims, 11 Drawing Sheets

(52) U.S. Cl.
CPC .............. *G05B 2219/37378* (2013.01); *G05B 2219/49177* (2013.01)

(58) Field of Classification Search
USPC .......................................................... 703/7
See application file for complete search history.

(56) References Cited

U.S. PATENT DOCUMENTS

| | | | | |
|---|---|---|---|---|
| 4,739,488 A * | 4/1988 | Asakura | ........... | G05B 19/40938 483/5 |
| 5,180,956 A * | 1/1993 | Oaki | ........... | B25J 9/163 318/561 |
| 5,475,291 A * | 12/1995 | Yoshida | ........... | G05B 13/024 318/568.22 |
| 5,575,597 A * | 11/1996 | Bailey | ........... | B23Q 1/5462 408/234 |
| 6,077,302 A * | 6/2000 | Kumra | ........... | G05B 13/042 703/1 |
| 6,107,707 A * | 8/2000 | Dwyer | ........... | H02K 5/24 310/118 |
| 6,198,246 B1 * | 3/2001 | Yutkowitz | ........... | G05B 11/42 318/561 |
| 6,285,155 B1 * | 9/2001 | Maske | ........... | H02P 8/32 318/685 |
| 6,584,367 B1 * | 6/2003 | Makino | ........... | G05B 19/195 318/561 |
| 6,822,415 B1 * | 11/2004 | Komiya | ........... | H02P 29/50 318/560 |
| 7,341,410 B2 * | 3/2008 | Hill | ........... | B23Q 17/0971 409/234 |
| 7,659,682 B2 * | 2/2010 | Matsumoto | ........... | G05B 19/41 318/432 |
| 8,024,068 B2 * | 9/2011 | Gray | ........... | B25J 9/1602 382/153 |
| 8,744,612 B2 * | 6/2014 | Ide | ........... | G05B 19/4163 318/568.18 |
| 9,588,511 B2 * | 3/2017 | Gray | ........... | G05B 19/4097 |
| 9,913,644 B2 * | 3/2018 | McCuen | ........... | A61B 17/07207 |
| 2001/0017824 A1 * | 8/2001 | Okada | ........... | G11B 7/08529 369/32.01 |
| 2002/0075225 A1 * | 6/2002 | Schena | ........... | A63F 13/06 345/156 |
| 2002/0156541 A1 * | 10/2002 | Yutkowitz | ........... | G05B 11/28 700/28 |
| 2003/0184252 A1 * | 10/2003 | Takamune | ........... | G05B 19/404 318/632 |
| 2003/0204285 A1 * | 10/2003 | Thomas | ........... | G05B 19/4097 700/182 |
| 2005/0021265 A1 * | 1/2005 | Esterling | ........... | G05B 19/401 702/76 |
| 2005/0055323 A1 * | 3/2005 | Zetek | ........... | G05B 19/4183 |
| 2005/0067996 A1 * | 3/2005 | Eba | ........... | G05B 19/19 318/609 |
| 2005/0139678 A1 * | 6/2005 | Helsel | ........... | G02B 26/0833 235/462.37 |
| 2005/0188309 A1 * | 8/2005 | Tasker | ........... | G05B 19/40933 715/700 |
| 2005/0277305 A1 * | 12/2005 | Tanioka | ........... | H04N 1/053 438/788 |
| 2006/0147237 A1 * | 7/2006 | Hayashi | ........... | B41J 19/202 400/76 |
| 2006/0173652 A1 * | 8/2006 | Abbotoy | ........... | G01M 1/00 702/179 |
| 2006/0186845 A1 * | 8/2006 | Terada | ........... | G05B 19/19 318/432 |
| 2006/0244407 A1 * | 11/2006 | Lawrence | ........... | G05B 19/40 318/685 |
| 2008/0091295 A1 * | 4/2008 | Corey | ........... | G05B 19/40937 700/178 |
| 2008/0245159 A1 * | 10/2008 | Garshelis | ........... | G01L 3/102 73/862.27 |
| 2009/0107308 A1 * | 4/2009 | Woody | ........... | B23B 1/00 82/1.11 |
| 2009/0261773 A1 * | 10/2009 | Hirose | ........... | H02P 23/14 318/623 |
| 2010/0052593 A1 * | 3/2010 | Kishimoto | ........... | H02P 23/22 318/561 |
| 2010/0295497 A1 * | 11/2010 | Takamatsu | ........... | H02P 23/18 318/671 |
| 2011/0254496 A1 * | 10/2011 | Barkman | ........... | B23Q 17/20 318/561 |
| 2012/0039679 A1 * | 2/2012 | Kundracik | ........... | B23G 1/225 408/1 R |
| 2013/0320798 A1 * | 12/2013 | Islam | ........... | H02K 1/276 310/156.53 |
| 2016/0048116 A1 * | 2/2016 | Imada | ........... | G05B 19/19 318/567 |
| 2016/0181961 A1 * | 6/2016 | Holmburg | ........... | H02P 21/14 318/400.02 |

FOREIGN PATENT DOCUMENTS

| | | |
|---|---|---|
| JP | 3-95605 A | 4/1991 |
| JP | 9-128037 A | 5/1997 |
| JP | 2002-202801 A | 7/2002 |
| JP | 2005-214711 A | 8/2005 |
| JP | 2006-333594 A | 12/2006 |
| JP | 2009-192837 A | 8/2009 |
| WO | WO 2005/022107 A1 | 3/2005 |

OTHER PUBLICATIONS

Japanese Office Action dated Jul. 31, 2017 in Patent Application No. 2015-550237 (with English Translation).
International Search Report dated Mar. 4, 2014 in PCT/JP13/081800 Filed Nov. 26, 2013.
Extended European Search Report dated Dec. 22, 2016 in patent application No. 13898413.3.

* cited by examiner $$\omega 1 = \sqrt{\frac{k(M1 + M2)}{M1 \cdot M2}}$$

$$\omega 2 = \sqrt{\frac{k}{M2}}$$

$$\Rightarrow \frac{M2}{M1} = \frac{\omega 1^2 - \omega 2^2}{\omega 2^2}$$

METHOD AND APPARATUS FOR SUPPORTING DESIGN IMPROVEMENT WORK OF MECHANICAL APPARATUS

TECHNICAL FIELD

A technology disclosed herein relates to a technology for supporting work of improving the design of a mechanical apparatus which is operated by a motor.

BACKGROUND ART

A mechanical apparatus which is operated by a motor, specifically, a mechanical apparatus which controls an operation of a movable section by the motor, is widely used. In this type of the mechanical apparatus, in order to accurately control a position or velocity of the movable section, a feedback control, a feedforward control, or a motor control combining the feedback control and the feedforward control, is performed. As the feedback control, for example, a P (proportional) control, a PI (proportional integral) control, and a PID (proportional integral and derivative) control, are known.

In a case where the motor is controlled, it is necessary to appropriately select the control parameters. In this regard, for example, as described in JP-A-9-128037 and JP-A-2002-202801, a motor control device which has a function of automatically optimizing the control parameters, that is, a so-called auto-tuning function, is used. In addition, in the related art, the technology for optimizing the control parameters without necessity of an auto-tuning control, is described. Herein, the present description incorporates the content described in the related art by reference.

SUMMARY

Technical Problem

However, even when the control parameters are optimized, operation performance of the mechanical apparatus is not improved as much as the optimization, and there is a case where a required level is not satisfied. In this case, it is assumed that there is a certain problem in the design of the mechanical apparatus, but it is difficult to specify which part of the mechanical apparatus should be improved. Therefore, a designer relies on experience and intuition, and performs work of improving the design of the mechanical apparatus, and in this work, a great deal of time and effort is required.

In consideration of the above-described situation, an object of the present description is to provide a technology which is efficient in supporting the work of improving the design of the mechanical apparatus which is operated by a motor.

Problem to be Solved

The present description discloses a method for supporting the work of improving the design of a mechanical apparatus which is operated by a motor. This method includes an operating step of operating a movable section of the mechanical apparatus by the motor. In the operating step, for example, it is preferable that the movable section of the mechanical apparatus performs an oscillation motion (reciprocation motion), the movable section of the mechanical apparatus performs a uniform motion, or the movable section of the mechanical apparatus performs an acceleration/deceleration motion.

This method further includes a measuring step of obtaining at least one index which indicates an input into the motor or an output from the motor in the operating step. In the measuring step, for example, it is preferable that anyone or both of the input index which indicates the input into the motor over time and the output index which indicates the output from the motor over time, are obtained. In this case, although not particularly limited, it is preferable to obtain a current index which indicates the current of the motor over time, a torque index which indicates the torque of the motor over time, a position index which indicates the rotation position of the motor over time, and a velocity index which indicates the velocity of the motor over time, as the input index or the output index.

This method further includes a determining step of determining the mechanical properties of the mechanical apparatus, by using at least one index obtained in the measuring step. In the determining step, although not particularly limited, for example, it is preferable to determine at least one of the frequency properties of the output with respect to the input of the motor, the position-torque properties which illustrate the relationship between a rotation position and the torque of the motor, and the velocity-torque properties which illustrate the relationship between the velocity and the torque of the motor.

This method further specifies at least one improvement-required item which is required to be improved in the design of the mechanical apparatus, by using the mechanical properties determined in the determining step. In the determining step, although not particularly limited, for example, it is possible to specify whether or not the rigidity of the mechanical apparatus is the improvement-required item, by using the frequency properties of the motor. Alternatively, it is possible to specify whether or not the tooth contact of the gear connected to the motor and the cogging torque of the motor is the improvement-required item, by using the position-torque properties of the motor. Alternatively, it is possible to specify whether or not the friction according to the motion of the movable section is the improvement-required item, by using the velocity-torque properties of the motor.

In this method, the designer can specify the item which is required to be improved in the design of the mechanical apparatus without relying on experience and intuition. In addition, the designer can reliably improve performance of the mechanical apparatus by improving the item in the design of the mechanical apparatus.

The present description discloses an apparatus which supports work of improving the design of the mechanical apparatus which is operated by a motor. This apparatus performs at least an operating step of operating a movable section of the mechanical apparatus by the motor, a measuring step of obtaining at least one index which indicates an input into the motor or an output from the motor in the operating step, a determining step of determining the mechanical properties of the mechanical apparatus, by using at least one index obtained in the measuring step, and a specifying step of specifying at least one improvement-required item which is required to be improved in the design of the mechanical apparatus, by using the mechanical properties determined in the determining step.

BRIEF DESCRIPTION OF DRAWINGS

FIG. 6 shows views illustrating a position index and a current index which are obtained in the first sub-step as an example.

FIG. 8 shows views illustrating a velocity index and a torque index which are obtained in the second sub-step as an example.

FIG. 10 shows views illustrating a second velocity index and a second torque index which are obtained in the third sub-step as an example.

DESCRIPTION OF EMBODIMENTS

Figure 1:
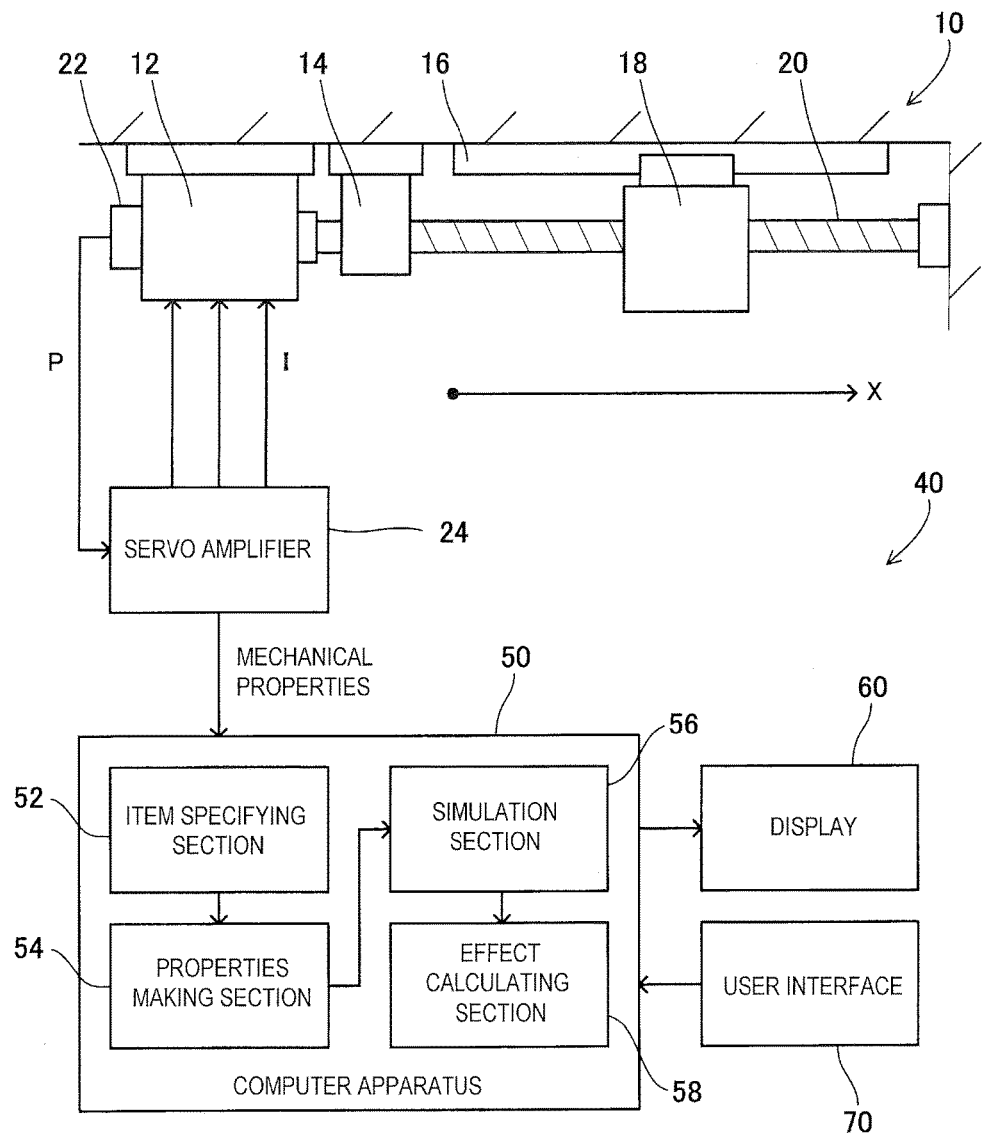
FIG. 1 is a view schematically illustrating a configuration of a mechanical apparatus and a supporting apparatus.

In one embodiment of the technology, in an operating step, it is preferable that an oscillation motion (reciprocation motion) of a movable section is performed. In addition, in a measuring step, it is preferable that at least an input index which indicates an input into a motor over time, and an output index which indicates an output from the motor over time, are obtained. In addition, in a determining step, it is preferable that the frequency properties of the output with respect to the input of the motor is determined by using the input index and the output index. In addition, in a specifying step, it is preferable to specify whether or not the rigidity of a mechanical apparatus is an improvement-required item by using the frequency properties.

In the determining step, it is preferable to respectively calculate a frequency component of the input index and a frequency component of the output index, and to determine the frequency properties of the mechanical apparatus by using the frequency component of the input index and the frequency component of the output index. In this case, for example, it is possible to determine the frequency properties by dividing the frequency component of the output index by the frequency component of the input index.

Although not particularly limited, it is preferable that the input index is a current index which indicates the current of the motor over time. In addition, although not particularly limited, it is preferable that the output index is a position index which indicates a rotation position of the motor over time, or a velocity index which indicates the velocity of the motor over time. Here, the current of the motor and the torque of the motor are related to each other. Therefore, the current index is not limited to a measured value which is obtained by measuring the current of the motor over time, and may be a measured value which is obtained by measuring the torque of the motor over time.

In the specifying step, it is preferable to specify whether or not the rigidity of the mechanical apparatus is the improvement-required item based on at least one of a resonance frequency which takes the maximum value in the frequency properties of the mechanical apparatus and an anti-resonance frequency which takes the minimum value. In a case where a part at which the rigidity is not sufficient in the mechanical apparatus is present, in the frequency properties of the mechanical apparatus, a peak of the maximum value and the minimum value appears. Therefore, by focusing on the resonance frequency which takes the maximum value or the anti-resonance frequency which takes the minimum value, it is possible to obtain information on the presence of the part at which the rigidity is not sufficient and information which can specify the position.

As an example, when the resonance frequency and the anti-resonance frequency are used, it is possible to calculate a mass ratio related to the movable section. The mass ratio will be described later in detail, but the mass ratio between the mass connected to one side of the part at which the rigidity is not sufficient, and the mass connected to the other side, is illustrated. Therefore, by using the mass ratio, it is possible to specify the part at which the rigidity is not sufficient in the movable section.

As another example, there is a case where at least one of the resonance frequency and the anti-resonance frequency significantly changes in accordance with the position of the movable section. In this case, it is possible to determine that the rigidity of a member which extends along the moving direction of the movable section, for example, the rigidity of a feed screw connected to the movable section, is not sufficient, and to specify that the rigidity of the member (feed screw) is the improvement-required item.

In a first embodiment of the technology, in the operating step, it is preferable to perform at least a uniform motion of the movable section. In the measuring step, it is preferable to obtain at least the position index which indicates the rotation position of the motor over time, and the torque index which indicates the torque of the motor over time. In the determining step, it is preferable to determine position-torque properties which illustrate a relationship between the position and the torque of the motor, by using the position index and the torque index. In addition, in the specifying step, it is preferable to specify whether or not a tooth contact of a gear connected to the motor or cogging torque of the motor is the improvement-required item, by using the position-torque properties.

In particular, in the specifying step, it is preferable to calculate the frequency component of the above-described position-torque properties, and to specify whether or not the tooth contact of the gear connected to the motor or the cogging torque of the motor is the improvement-required item, based on the frequency component. When the tooth contact of the gear connected to the motor or the cogging torque of the motor is defective, the position-torque properties of the motor significantly changes at a certain frequency. Therefore, by focusing on the frequency component of the position-torque properties of the motor, it is possible to specify whether or not the tooth contact or the cogging torque is the improvement-required item.

In one embodiment of the technology, in the operating step, it is preferable to perform at least the uniform motion of the movable section under a plurality of velocity conditions. In the measuring step, at least in each velocity condition, it is preferable to obtain the velocity index which indicates the rotational velocity of the motor and the torque index which indicates the torque of the motor. In the determining step, it is preferable to determine velocity-torque properties which illustrate a relationship between the velocity and the torque of the motor, by using the velocity index and the torque index which are obtained in each velocity condition. In addition, in the specifying step, it is preferable to specify whether or not friction according to the motion of the movable section is the improvement-required item, by using the velocity-torque properties of the motor.

In the above-described embodiment, in the operating step, it is preferable to further perform an acceleration/deceleration motion of the movable section. In the measuring step, it is preferable to further obtain a second torque index which indicates the torque of the motor during the acceleration/deceleration motion over time, and a second velocity index which indicates the rotational velocity of the motor over time. In the determining step, it is preferable to further determine a correction torque index excluding influence of the friction from the second torque index, by using the second torque index, the second velocity index, and the velocity-torque properties. Accordingly, in the specifying step, it is possible to further specify whether or not inertia of the movable section is the improvement-required item by using the correction torque index.

In one embodiment of the technology, it is preferable that the method (or the apparatus) further includes (performs) a performance calculation step of calculating operation performance after a design change of the mechanical apparatus, by making mechanical properties of the mechanical apparatus after the design change, and performing a simulation using the mechanical properties, on the assumption that the design of at least one improvement-required item specified in the specifying step is changed. In this configuration, the designer can confirm the effects of the design change before practically changing the design of the mechanical apparatus.

In addition, it is possible to easily determine the design of which item should be changed based on the calculated effect.

It is preferable that the method (or the apparatus) further includes (performs) an effect calculation step of calculating a performance difference of the mechanical apparatus before and after the design change, by using the operation performance after the design change calculated in the performance calculation step. In this configuration, it is possible to more easily grasp the effect of the design change.

Embodiment

As a specific embodiment of the technology, an apparatus and a method for supporting work of improving the design of the mechanical apparatus by a designer, will be described. FIG. 1 illustrates a mechanical apparatus 10 which is a target to be improved, and a supporting apparatus 40 which supports the work of improving the design of the mechanical apparatus 10. Here, in order to help understanding the technology, an example of the mechanical apparatus 10 having a simple configuration will be described, but a specific configuration of the mechanical apparatus 10 is not particularly limited. The technology can be widely employed with respect to the mechanical apparatus including the movable section which is operated by the motor.

As illustrated in FIG. 1, the mechanical apparatus 10 is provided with a motor 12 and a movable body 18 which is operated by the motor 12. The movable body 18 is supported by a guide rail 16. The motor 12 is connected to the movable body 18 via a decelerator 14 and a feed screw 20. The feed screw 20 converts a rotation motion of the motor 12 into a rectilinear motion of the movable body 18. The feed screw 20 extends along the moving direction of the movable body 18. Hereinafter, there is a case where the moving direction of the movable body 18 is expressed as the X direction, and the positions of the movable body 18 are expressed as X1, X2, . . . .

The mechanical apparatus 10 is provided with a servo amplifier 24. The servo amplifier 24 is a control device which performs a PID control with respect to the motor 12. The motor 12 of the example is a servo motor, and includes an encoder 22 which detects a rotation position P of the motor 12. The encoder 22 is connected to the servo amplifier 24, and the encoder 22 controls current I which flows in the motor 12 based on the detected rotation position P of the motor 12.

The servo amplifier 24 in the example has an auto-tuning function which automatically optimizes the control parameters of the PID control. In the auto-tuning function, the servo amplifier 24 operates the movable section by the motor 12, and measures an index (current, torque, rotation position, rotational velocity) which illustrates an input into the motor 12 and an output from the motor 12 between the servo amplifier 24 and the motor 12. In addition, the servo amplifier 24 determines the mechanical properties of the mechanical apparatus 10 based on the measured index, and determines the control parameters in accordance with the determined mechanical properties. As will be described later, the supporting apparatus 40 of the example obtains the mechanical properties of the mechanical apparatus 10 by using the auto-tuning function of the servo amplifier 24.

Next, a configuration of the supporting apparatus 40 will be described. The supporting apparatus 40 is provided with a computer apparatus 50, a display 60, and a user interface 70. The computer apparatus 50 is connected to the servo amplifier 24 to be communicable, and can obtain the mechanical properties of the mechanical apparatus 10 determined by the auto-tuning function or the optimized control parameters, from the servo amplifier 24. The computer apparatus 50 is functionally provided with an item specifying section 52, a properties making section 54, a simulation section 56, and an effect calculating section 58.

The item specifying section 52 performs processing of specifying improvement-required item by using the mechanical properties of the mechanical apparatus 10 obtained from the servo amplifier 24. The improvement-required item which is mentioned here means an item which is required to be improved in the design of the mechanical apparatus 10. The properties making section 54 performs processing of making the mechanical properties of the mechanical apparatus 10 after the design change on the assumption that the design of one or plural improvement-required items specified by the item specifying section 52 is changed. The improvement-required item which is assumed that the design thereof has been changed, and the extent of the improvement can be selected by the properties making section 54 itself, and not only that, can be instructed by the designer by using the user interface 70.

The simulation section 56 can calculate operation performance of the mechanical apparatus 10 by performing the simulation using the mechanical properties of the mechanical apparatus 10. The operation performance which is mentioned here is not particularly limited, but means one or plural properties, such as the maximum velocity, the maximum acceleration, the maximum deceleration, positioning precision, and time required for the positioning of the movable section 18. The simulation section 56 can calculate the operation performance of the mechanical apparatus 10 after the design change by using the mechanical properties after the design change made by the properties making section 54. In addition, the simulation section 56 can calculate the operation performance of the mechanical apparatus 10 before the design change, by using the practical mechanical properties determined by the servo amplifier 24. The effect calculating section 58 can calculate the performance difference (effect) by using the operation performance before and after the design change calculated by the simulation section 56. Various pieces of information made by processing performed by the item specifying section 52, the properties making section 54, the simulation section 56, and the effect calculating section 58, are displayed on the display 60, and suggested to the designer.

Figure 2:
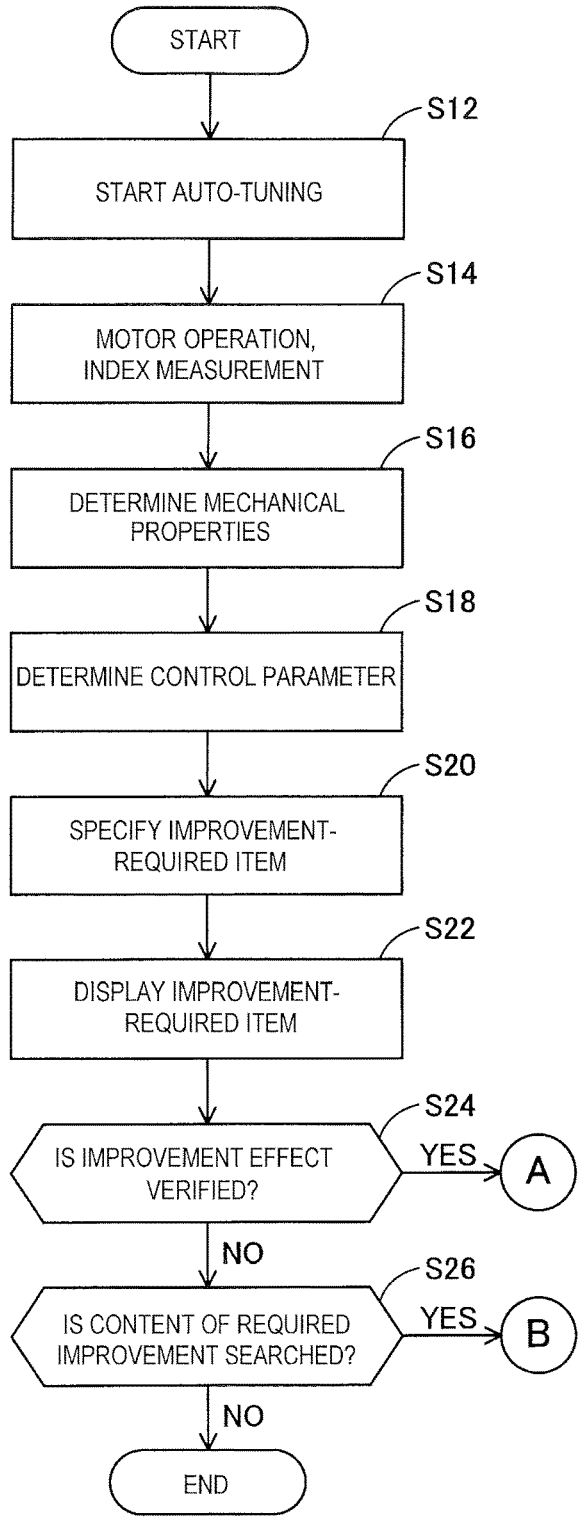
FIG. 2 is a flow chart illustrating a flow of a supporting method which uses the supporting apparatus.
Figure 3:
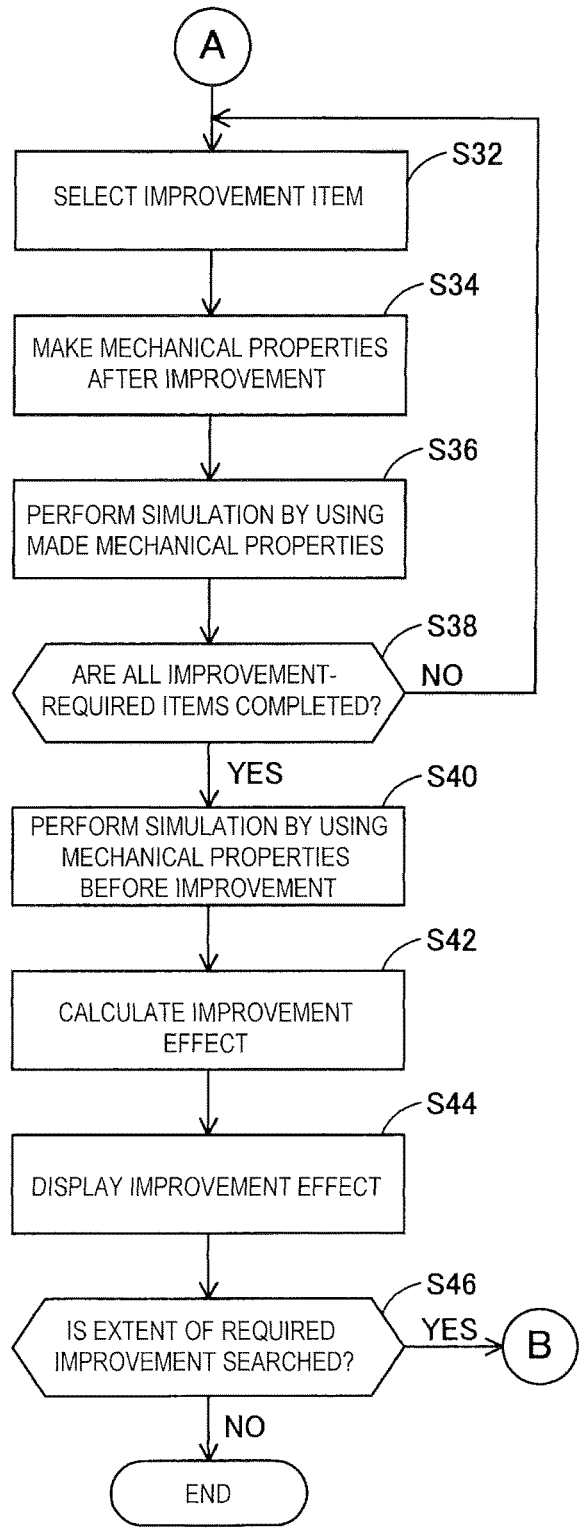
FIG. 3 is a flow chart illustrating a flow of the supporting method which uses the supporting apparatus.
Figure 4:
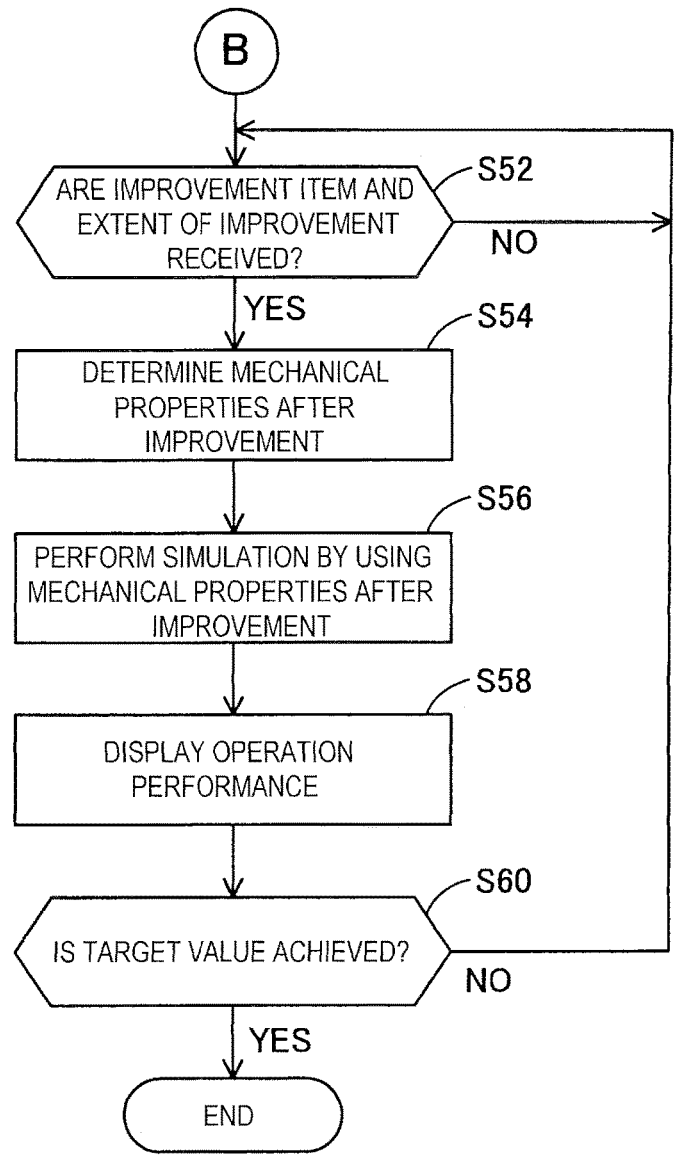
FIG. 4 is a flow chart illustrating a flow of the supporting method which uses the supporting apparatus.

FIGS. 2, 3, and 4 illustrate a flow of a supporting method for supporting the work of improving the design of the mechanical apparatus 10 by the designer, by using the supporting apparatus 40. Hereinafter, each step of the supporting method will be described along the flow illustrated in FIGS. 2, 3, and 4.

In step S12 of FIG. 2, the servo amplifier 24 starts performing the auto-tuning function. Accordingly, in step S14, while operating the movable section by the motor 12, the servo amplifier 24 measures a plurality of indexes which illustrate the input or the output of the motor 12 (S14). In step S14, three sub-steps which will be described below are included.

Figure 5:
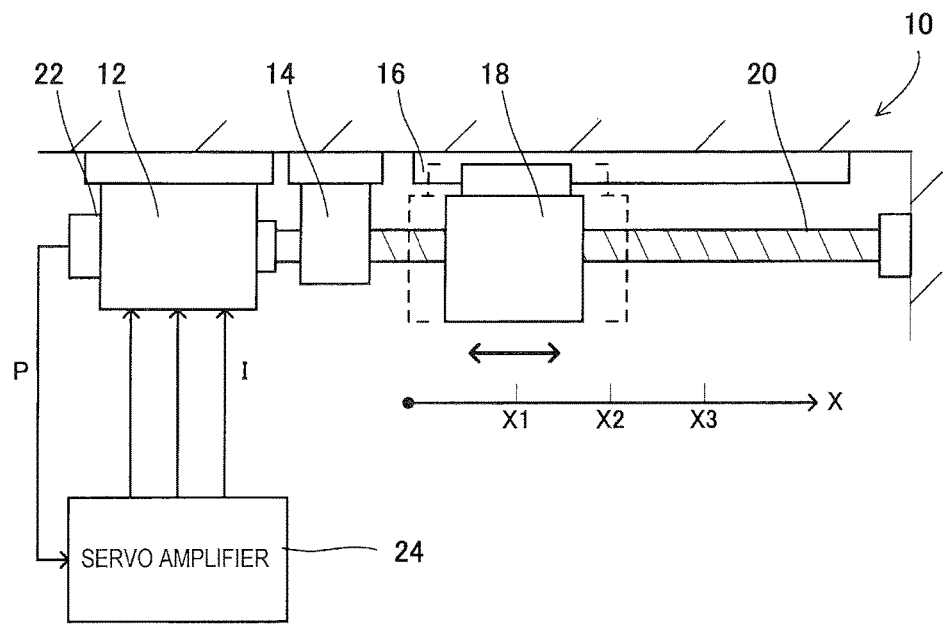
FIG. 5 is a view illustrating a first sub-step of making a movable section perform an oscillation motion.
Figure 6A:
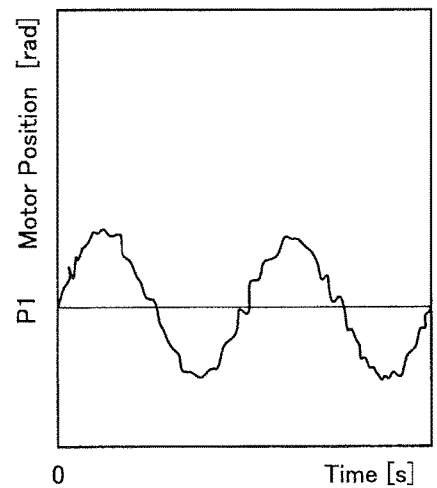
FIG. 6A is a graph illustrating an example of the position index, a horizontal axis illustrates time, and a vertical axis illustrates a rotation position of a motor.
Figure 6B:
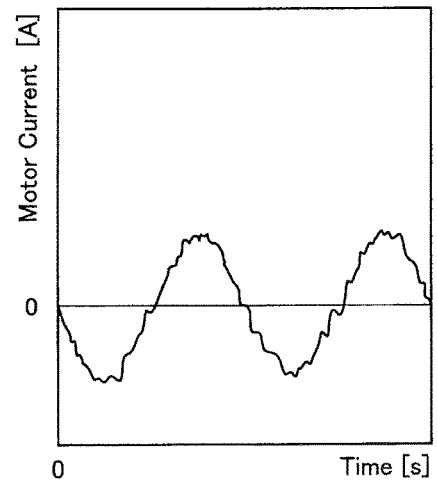
FIG. 6B is a graph illustrating the current index, a horizontal axis illustrates time, and a vertical axis illustrates the current of the motor.

As illustrated in FIG. 5, in the first sub-step, the servo amplifier 24 controls the motor 12 so that the movable body 18 performs the oscillation motion (reciprocation motion). In addition, the servo amplifier 24 measures the rotation position and the current of the motor 12 during the control over time. Accordingly, the position index which indicates the rotation position of the motor 12 over time, and the current index which indicates the current of the motor 12 over time, are obtained. FIG. 6 illustrates each of the position index and the current index. The first sub-step is repeatedly performed while changing the center (X=X1, X2, X3, . . . ) which makes the movable body 18 perform the oscillation motion. Accordingly, the position index and the current index are obtained for every center of the oscillation motion. Here, the current index is an example of the input index, and can be changed to other input indexes. In addition, the position index is an example of the output index, and can be changed to other output indexes.

Figure 7:
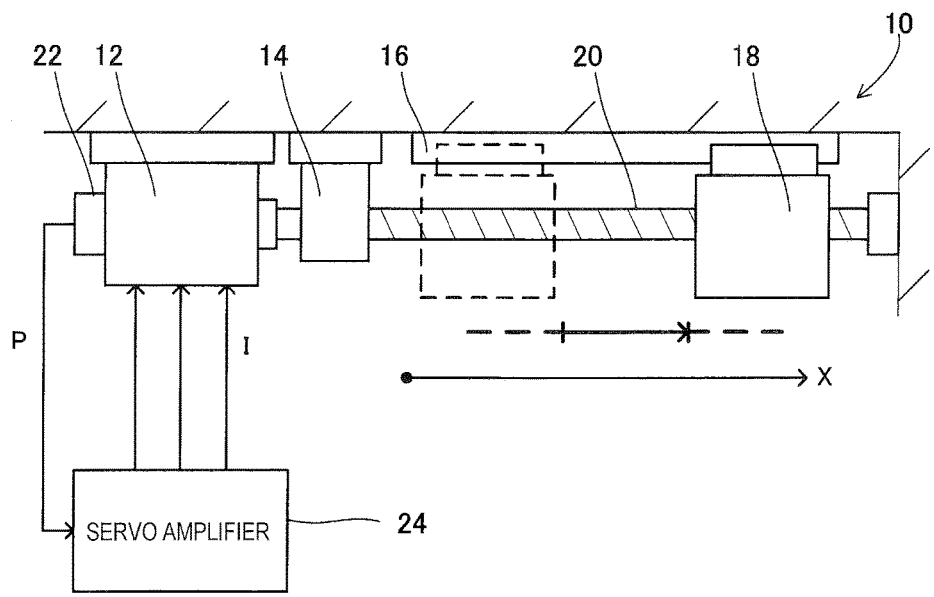
FIG. 7 is a view illustrating a second sub-step of making the movable section perform a uniform motion.
Figure 8A:
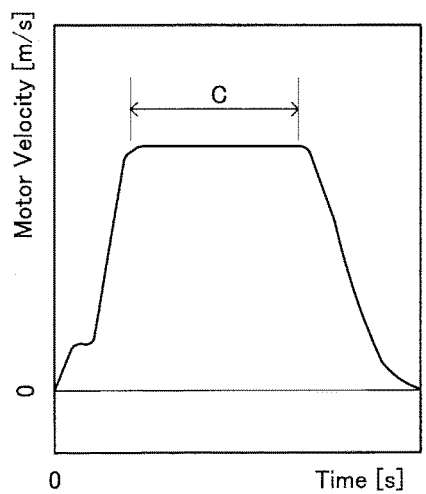
FIG. 8A is a graph illustrating an example of the velocity index, a horizontal axis illustrates time, and a vertical axis illustrates the velocity of the motor.
Figure 8B:
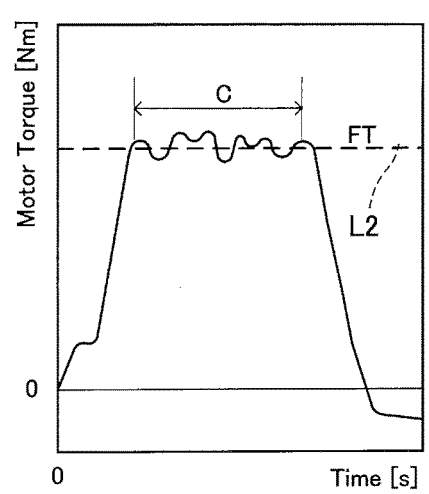
FIG. 8B is a graph illustrating an example of the torque index, a horizontal axis illustrates time, and a vertical axis illustrates the torque of the motor.

As illustrated in FIG. 7, in the second sub-step, the servo amplifier 24 controls the motor 12 so that the movable body 18 performs the uniform motion at least at a part of the period. In addition, the servo amplifier 24 measures the rotational velocity and the torque of the motor 12 during the control over time. Accordingly, the velocity index which indicates the rotational velocity of the motor 12 over time, and the torque index which indicates the torque of the motor 12 over time, are obtained. FIG. 8 illustrates each of the velocity index and the torque index which are obtained in the second sub-step, as an example. In addition, the servo amplifier 24 obtains the position index of the motor 12 from the output signal of the encoder 22, and obtains the velocity index of the motor 12 by calculating a time change ratio thereof. A period C in FIG. 8 illustrates a period of the uniform motion of the movable body 18, and a dotted line L2 illustrates an average value FT of the torque in the period C. Since the movable body 18 or the motor 12 perform the uniform motion, the average value FT of the torque in the period C corresponds to the friction generated by the motion of the movable section which is called the movable body 18 or the feed screw 20. In other words, as the friction increases, the average value FT of the torque increases. The second sub-step is repeatedly performed while changing the velocity condition which makes the movable body 18 perform the uniform motion. Accordingly, for every rotational velocity of the motor 12, the velocity index and the torque index are obtained, and the average value FT of the torque is calculated.

Figure 9:
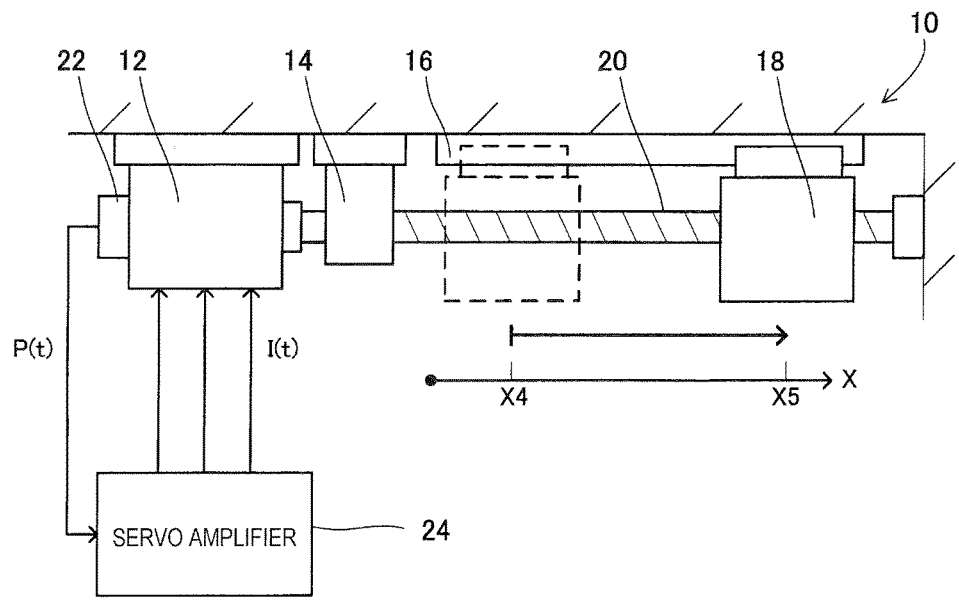
FIG. 9 is a view illustrating a third sub-step of making the movable section perform an acceleration/deceleration motion.
Figure 10A:
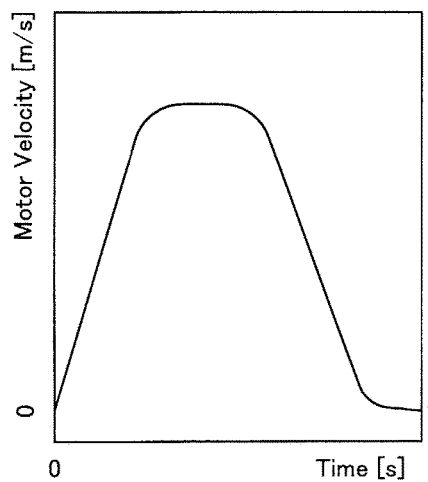
FIG. 10A is a graph illustrating an example of the second velocity index, a horizontal axis illustrates time, and a vertical axis illustrates the rotational velocity of the motor.
Figure 10B:
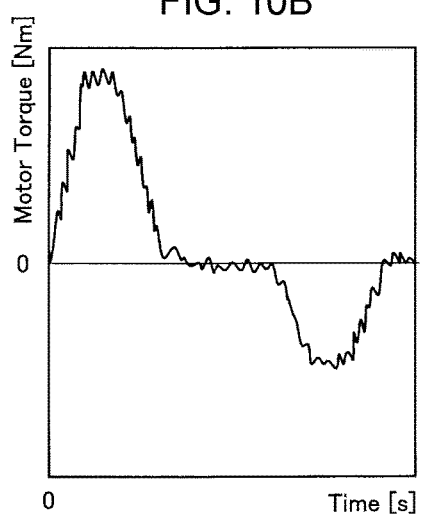
FIG. 10B is a graph illustrating an example of the second torque index, a horizontal axis illustrates time, and a vertical axis illustrates the torque of the motor.

As illustrated in FIG. 9, in the third sub-step, the servo amplifier 24 controls the motor 12 so that the movable body 18 starts from a starting position X4 and stops at a final position X5 during a short period of time. In other words, in the third sub-step, the servo amplifier 24 controls the motor 12 so that the movable body 18 relatively rapidly performs the acceleration/deceleration motion. In addition, the servo amplifier 24 measures the rotational velocity and the torque of the motor 12 during the control over time. Accordingly, the servo amplifier 24 obtains the second velocity index which indicates the rotational velocity of the motor 12 over time, and the second torque index which indicates the torque of the motor 12 over time. FIG. 10 illustrates each of the second velocity index and the second torque index which are obtained in the third sub-step as an example. Since the movable body 18 performs the acceleration/deceleration motion, the torque illustrated by the second torque index changes in accordance with the inertia (a mass and a moment of inertia) of the movable section which is called the movable body 18 or the feed screw 20. In other words, as the inertial of the movable sections increases, the torque illustrated by the second torque index increases.

Figure 11:
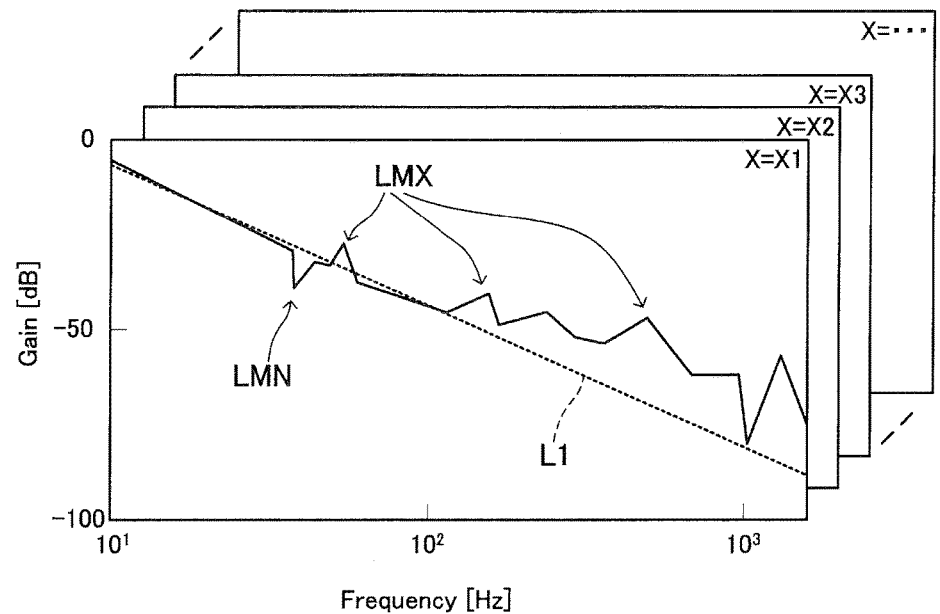
FIG. 11 is a graph illustrating an example of frequency properties of the mechanical apparatus. A horizontal axis illustrates a frequency, and a vertical axis illustrates a gain.

Returning to FIG. 2, in step S16, the servo amplifier 24 determines the mechanical properties of the mechanical apparatus 10 by using various types of indexes obtained in step S14. The mechanical properties determined by the servo amplifier 24 is instructed to the computer apparatus 50. The servo amplifier 24 determines the frequency properties of the output with respect to the input of the motor 12 as one of the mechanical properties. FIG. 11 illustrates an example of the frequency properties. In a case where each element of the mechanical apparatus 10 is a complete rigid body, the frequency properties become a straight line illustrated by a dotted line L1 in the drawing. Meanwhile, when the mechanical apparatus 10 includes an element having a low rigidity, a peak of the maximum value LMX and the minimum value LMN appears. The frequency which becomes the maximum value LMX illustrates the resonance frequency, and the frequency which becomes the minimum value LMN illustrates the anti-resonance frequency. The frequency properties are determined by using the current index and the position index which are obtained in the first sub-step. Specifically, the position index and the current index are respectively Fourier-transformed, and a frequency component $P(\omega)$ of the position index and a frequency component $I(\omega)$ of the current index, are respectively calculated. Then, by dividing the frequency component $P(\omega)$ of the position index by the frequency component $I(\omega)$ of the current index, it is possible to obtain the frequency properties illustrated in FIG. 11

Figure 12:
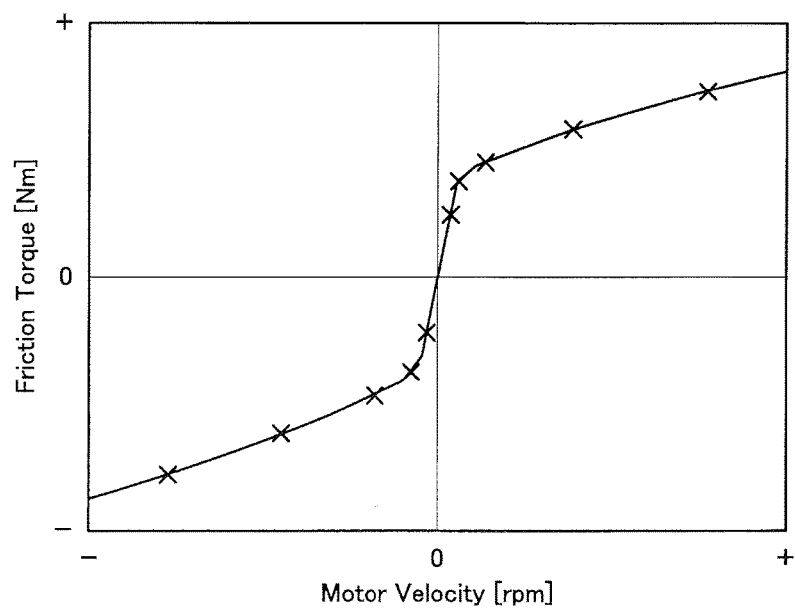
FIG. 12 is a graph illustrating an example of a velocity-torque index of the motor. A horizontal axis illustrates a rotational velocity of the motor, and a vertical axis illustrates the torque of the motor caused by friction.
Figure 13:
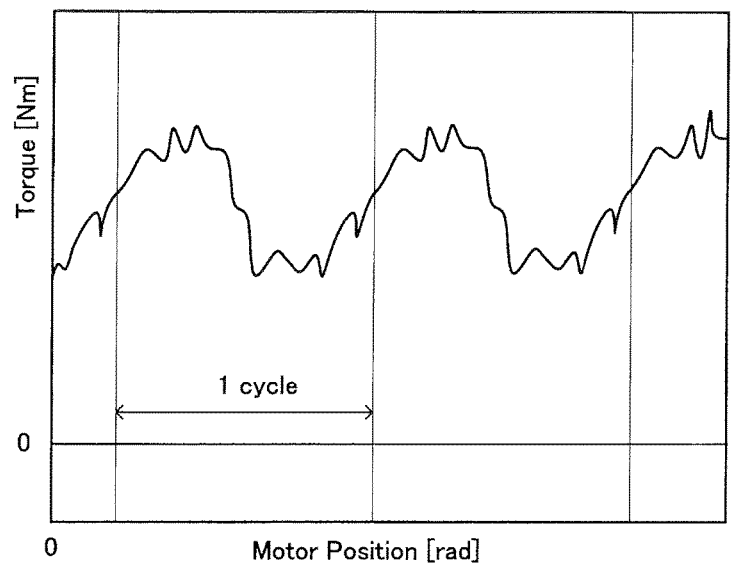
FIG. 13 is a graph illustrating an example of a position-torque index of the motor. A horizontal axis illustrates a rotation position of the motor, and a vertical axis illustrates the torque of the motor.

Additionally, the servo amplifier 24 determines the velocity-torque properties, the position-torque properties, and the correction torque index, as other mechanical properties. The velocity-torque properties are properties which illustrate a relationship between the rotational velocity and the torque of the motor 12. FIG. 12 illustrates an example of the velocity-torque properties. The velocity-torque properties are determined by plotting the torque average value FT for every rotational velocity of the motor 12 obtained in the second sub-step, in velocity-torque coordinates. The velocity-torque properties illustrate the size of the friction according to the motion of the movable section of the mechanical apparatus 10. The position-torque properties are properties which illustrate a relationship between the rotation position and the torque of the motor 12. FIG. 13 illustrates an example of the position-torque properties. The position-torque properties are determined by calculating a relational expression between the rotation position and the torque, by using the position index and the torque index which are obtained in the second sub-step. The position-torque properties illustrate pulsation of the torque with respect to the rotation position of the motor 12.

Figure 14:
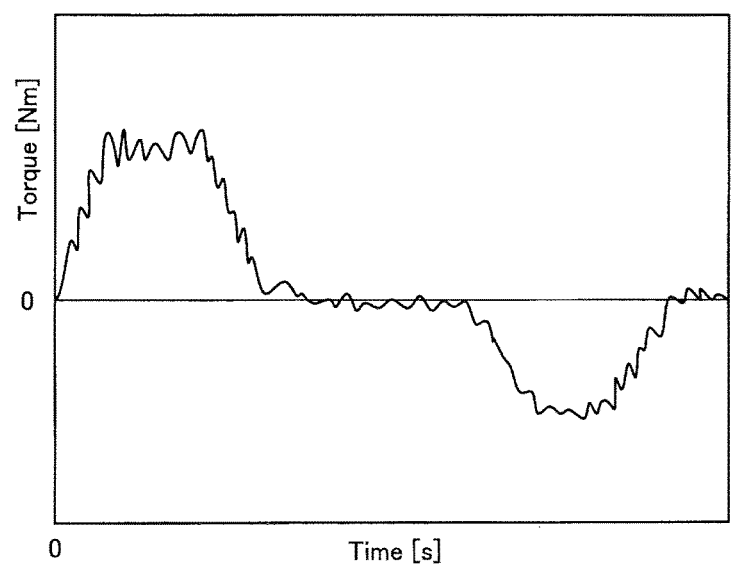
FIG. 14 is a graph illustrating an example of a correction torque index of the motor. A horizontal axis illustrates time, and a vertical axis illustrates the torque of the motor.

The correction torque index excludes the influence of the friction from the second torque index obtained in the third sub-step. FIG. 14 illustrates an example of the correction torque index. The correction torque index is determined by using the second velocity index, the second torque index, and the velocity-torque properties illustrated in FIG. 12. Specifically, first, the torque of the motor 12 caused by the friction is determined at each time, by using the second velocity index and the velocity-torque properties. In addition, by subtracting the torque caused by the friction from the second torque index, the second torque index is determined. The second torque index illustrates the size of the inertia of the movable section which is called the movable body 18 or the feed screw 20 of the mechanical apparatus 10.

Returning to FIG. 2, in step S18, the servo amplifier 24 determines the most appropriate control parameters in the mechanical apparatus 10 by using various types of mechanical properties determined in step S16. The control parameters determined by the servo amplifier 24 is instructed to the computer apparatus 50.

In step S20, the item specifying section 52 of the computer apparatus 50 performs processing of specifying the improvement-required item. In the processing, various types of mechanical properties instructed from the servo amplifier 24 are used. Firstly, the item specifying section 52 specifies whether or not the rigidity of the mechanical apparatus 10 is the improvement-required item by using the frequency properties (refer to FIG. 11) of the mechanical apparatus 10. As illustrated in FIG. 14, the item specifying section 52 performs peak detection from a low frequency side, and detects a resonance frequency $\omega 1$ and an anti-resonance frequency $\omega 2$, in at least one of the frequency properties. In addition, in a case where the resonance frequency $\omega 1$ or the anti-resonance frequency $\omega 2$ is detected within a predetermined frequency region, the item specifying section 52 specifies that the rigidity of the mechanical apparatus 10 is the improvement-required item.

Figure 16:
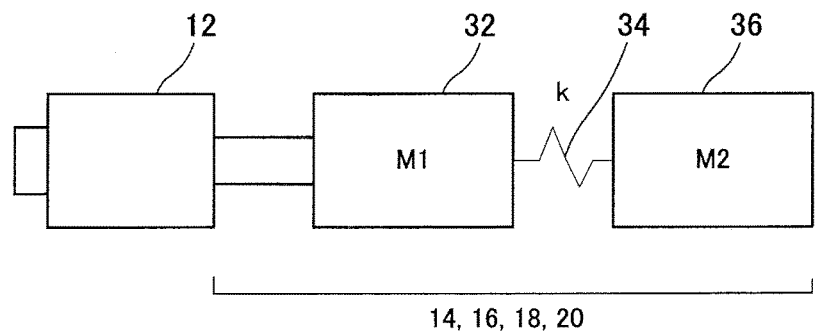
FIG. 16 is a view illustrating a relationship between the resonance frequency and the anti-resonance frequency, and a mass ratio of the movable section.

In a case where the resonance frequency $\omega 1$ and the anti-resonance frequency $\omega 2$ are detected, the item specifying section 52 further performs processing of specifying the element (component) having insufficient rigidity. As illustrated in FIG. 16 by modelling, it is assumed that an element 34 having insufficient rigidity is present in the movable section (including a rotating shaft of the motor 12, a plurality of gears of the decelerator 14, the movable body 18, and the feed screw 20) of the mechanical apparatus 10. In this case, the resonance frequency $\omega 1$ and the anti-resonance frequency $\omega 2$ are determined by a modulus of elasticity k of the element 34, a mass M1 of a first part 32 connected to one side (motor 12 side) of the element 34, and a mass M2 of a second part 36 connected to the other side of the element 34. Based on this, the item specifying section 52 calculates a mass ratio M2/M1 of the movable section which borders the element 34 having insufficient rigidity, by using the resonance frequency $\omega 1$ and the anti-resonance frequency $\omega 2$. In addition, the item specifying section 52 specifies the element having insufficient rigidity with reference to design information (for example, CAD data) of the mechanical apparatus 10 stored in advance. In addition, the specification of the element having insufficient rigidity may be performed by the designer based on the mass ratio M2/M1 calculated by the item specifying section 52.

Additionally, regarding the plurality of frequency properties determined at every position (X1, X2, X3, . . . ) of the movable body 18, the item specifying section 52 performs processing of specifying the above-described resonance frequency $\omega 1$ and the anti-resonance frequency $\omega 2$. In addition, in a case where the resonance frequency $\omega 1$ or the anti-resonance frequency $\omega 2$ changes in accordance with the positions (X1, X2, X3, . . . ) of the movable body 18, the item specifying section 52 determines that the rigidity of the member which extends along the moving direction X of the movable body 18, that is, the rigidity of the feed screw 20, is not sufficient.

Secondly, the item specifying section 52 specifies whether or not the friction generated by the mechanical apparatus 10 is the improvement-required item by using the velocity-torque properties (refer to FIG. 12). For example, the item specifying section 52 specifies the expected maximum torque in the highest rotational velocity (or other predetermined velocities) of the motor 12 expected by the mechanical apparatus 10, from the velocity-torque properties. In addition, in a case where the specified expected maximum torque exceeds a predetermined threshold value (for example, 30 percent of rating torque of the motor 12), the item specifying section 52 specifies that the friction generated by the mechanical apparatus 10 is the improvement-required item. In addition, in the velocity-torqued properties, in a case where a value of the torque in a predetermined low velocity region exceeds a predetermined threshold value (for example, 10 percent of the rating torque of the motor 12), the item specifying section 52 determines that non-linearity is remarkable, and specifies that the friction generated by the mechanical apparatus 10 is the improvement-required item.

Figure 17:
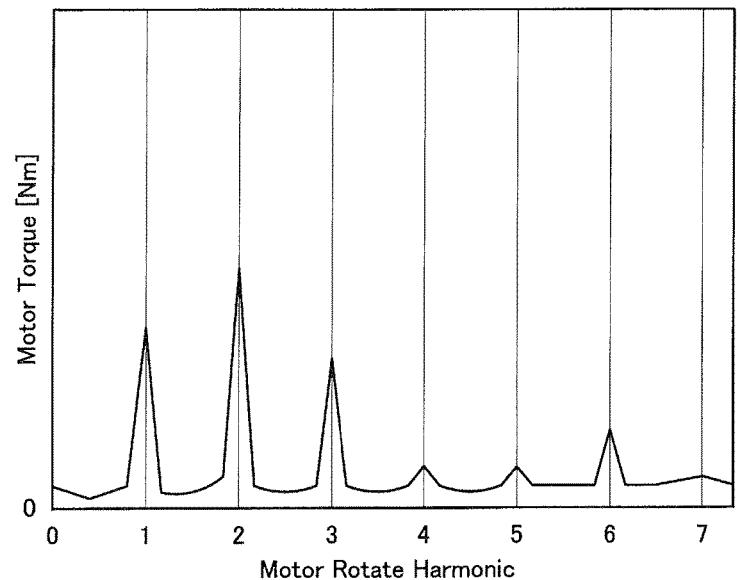
FIG. 17 is a view illustrating a relationship of a component with respect to the rotation of the motor of position-torque properties. A horizontal axis illustrates the component with respect to the rotation of the motor, and a vertical axis illustrates the torque of the motor.

Thirdly, the item specifying section 52 specifies whether or not the tooth contact of the decelerator 14 (or other gears) connected to the motor 12 or the cogging torque of the motor is the improvement-required item, by using the position-torque properties (refer to FIG. 13). Specifically, first, the item specifying section 52 Fourier-transforms the position-torque properties, and calculates a relationship of a component with respect to the rotation of the motor 12 of the position-torque properties. FIG. 17 illustrates an example of the component with respect to the rotation of the motor 12 of the position-torque properties. In the example illustrated in FIG. 17, since first, second, third, and sixth harmonic components are large, it is grasped that the component which oscillates one time, two times, three times and six times per a rotation of the motor 12 is large. The item specifying section. 52 performs the peak detection from the calculated relationship, and when the oscillation component which exceeds a predetermined threshold value is present, the item specifying section 52 specifies that the tooth contact of the decelerator 14 (or other gears) or the cogging torque of the motor 12 is the improvement-required item. In addition, similar processing may be performed with respect to the position-torque properties determined by other velocities of the motor 12, and it may be confirmed whether or not the same oscillation component is similarly detected. Accordingly, it is possible to perform processing with high precision.

Thirdly, the item specifying section 52 specifies whether or not the inertia of the movable section which is called the movable body 18 or the feed screw 20 is the improvement-required item, by using the correction torque index (refer to FIG. 14). As described above, the torque which is illustrated by the correction torque index increases as the inertia of the movable section which is called the movable body 18 and the feed screw 20 increases. According to this, the item specifying section 52 specifies the maximum torque from the correction torque index, and when the maximum torque exceeds a predetermined threshold value (for example, 200 percent of the rating torque), the item specifying section 52 specifies that the inertial of the movable section is the improvement-required item.

Returning to FIG. 2, in step S22, the improvement-required item specified by the item specifying section 52 is displayed on the display 60. Accordingly, the designer can ascertain which part of the design of the mechanical apparatus 10 should be improved. In step S24, in a case where the designer desires (YES), the computer apparatus 50 moves to processing of calculating the effect of a case where the improvement-required item is improved (to A of FIG. 3). In step S26, in a case where the designer desires (YES), the computer apparatus 50 moves to processing of calculating the improvement content for obtaining target performance (to B of FIG. 4).

Figure 15:
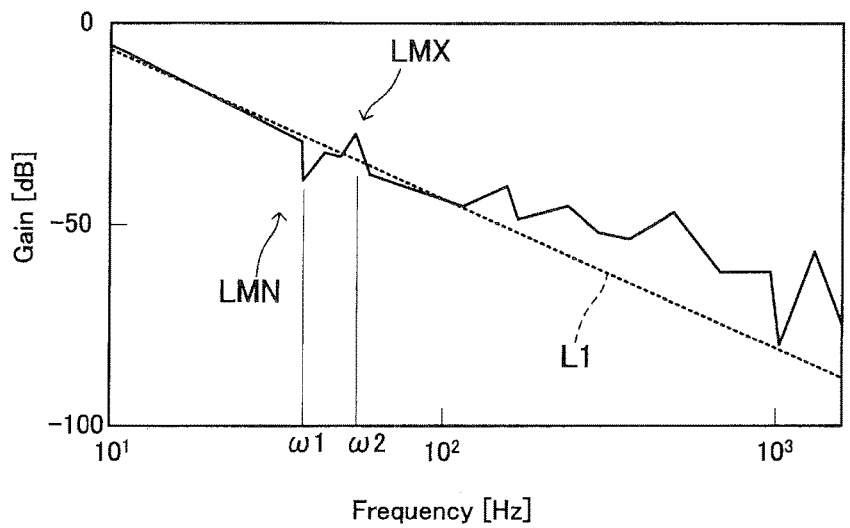
FIG. 15 is a view illustrating a resonance frequency and an anti-resonance frequency, by using the graph of the frequency properties.

With reference to FIG. 3, the processing of calculating the effect of a case where the improvement-required item is improved by the computer apparatus 50, will be described. First, in step S32, one item is selected as a target to be improved from the specified one or plural improvement-required items, by the properties making section 54. In step S34, the mechanical properties after the improvement is determined by the properties making section 54. For example, in a case where the target to be improved is the rigidity of the mechanical apparatus 10, the properties making section 54 makes the frequency properties which removed the peak of the resonance frequency ω1 and the anti-resonance frequency ω2, from the frequency properties (FIG. 15) determined in step S16. Otherwise, in a case where the target to be improved is the friction of the mechanical apparatus 10, the properties making section 54 makes the velocity-torque index in which the torque value deteriorated, from the velocity-torque index determined in step S16.

Figure 18:
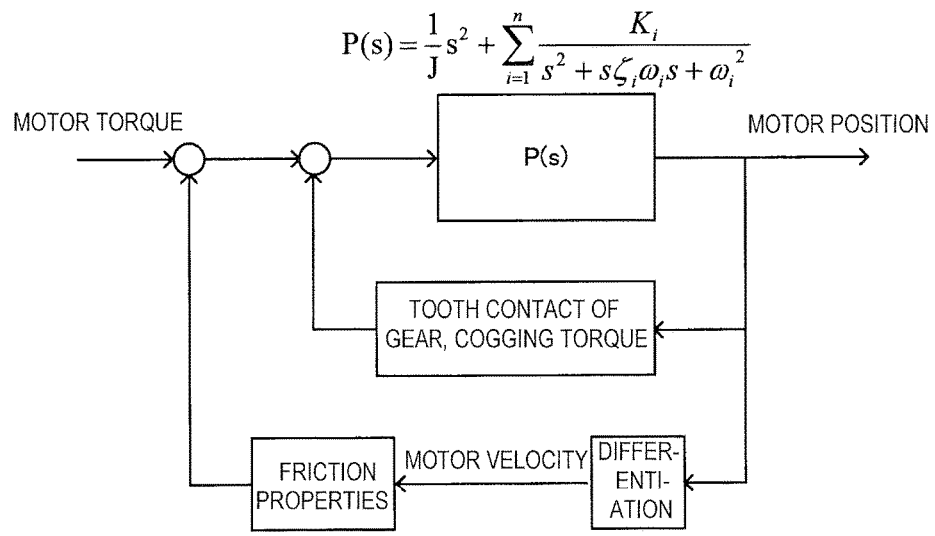
FIG. 18 is a block diagram illustrating a computation model using a simulation.

In step S36, the simulation section 56 performs the simulation by using the mechanical properties after the made improvement, and calculates the operation performance of the mechanical apparatus 10 after the improvement. The simulation can be performed by using a commercial simulation software which is called Matlab (registered trademark). FIG. 18 is an example, but illustrates a block diagram of a calculation model which is used in the simulation of the example. According to the calculation model, it is possible to calculate time series data which illustrates the position of the motor 12, from the time series data which describes the torque of the motor 12. Here, the "tooth contact of the gear and the cogging torque" in the block diagram, and the "friction properties", are expressed by calculating the torque by using the position-torque properties (refer to FIG. 13) or the velocity-torque properties (refer to FIG. 12) and subtracting the calculated torque from the torque of the input, with respect to the rotation position of the motor 12 and the differentiated rotational position of the motor 12. In addition, a coefficient of transmission p (s) which illustrates the inertia or oscillation properties of the mechanical apparatus 10 can be described in the expression in FIG. 18. Here, J in the expression is the moment of inertia, $K_i$ is an i-th gain of resonance, $\xi_i$ is an attenuation coefficient, $\omega_i$ is the resonance frequency, ands is a Laplace operator. In the expression, when the Laplace operator s is converted into js (j is an imaginary unit), the expression describes the frequency properties. By using this, as the frequency properties (refer to FIG. 11) of the mechanical apparatus 10 appear again, by determining each parameter, it is possible to determine the coefficient of transmission p(s). At this time, as a method of automatically determining each parameter, the most appropriate known method which is called a differential iterative method and a genetic algorithm (GA), may be employed.

Returning to FIG. 3, in step S38, the processing of the above-described S32 to S36 is repeatedly performed with respect to all of the specified improvement-required items, and after this, the process moves to processing of step S40. In step S40, in order to obtain criteria for comparison, the simulation section 56 performs the simulation by using the mechanical properties of the mechanical apparatus 10 before the improvement, and calculates the operation performance of the mechanical apparatus 10 before the improvement. In addition, the operation performance may be obtained by practically operating the mechanical apparatus 10. In step S42, the effect calculating section 58 calculates the performance difference before and after the improvement of the mechanical apparatus 10, that is, the effect of the improvement, by using the operation performance after the improvement calculated in S38, and the operation performance before the improvement calculated in S40. In step S44, the calculated effect of the improvement is displayed on the display 60. The designer can determine the design change of which improvement-required item of the mechanical apparatus 10 should be performed, by comparing the improvement effects displayed for every improvement-required item. In step S46, in a case where the designer desires (YES), the computer apparatus 50 moves to processing of calculating the improvement content for obtaining the target performance (to B of FIG. 4).

With reference to FIG. 4, the processing of calculating the improvement content for obtaining the target performance by the computer apparatus 50, will be described. First, in step S52, the properties making section 54 receives the instruction of the improvement item and the extent of the improvement by the designer. In other words, in step S52, since the designer instructs the item which is a target to be improved and the extent of the improvement, among one or plural improvement-required items displayed on the display 60. In step S54, the properties making section 54 determines the mechanical properties after the improvement based on the improvement item and the extent of the improvement instructed by the designer. In step S56, the simulation section 56 performs the simulation by using the made mechanical properties after the improvement, and calculates the operation performance of the mechanical apparatus 10 after the improvement. In step S58, the calculated operation performance is displayed on the display 60. In step S60, regarding the calculated operation performance, in a case where the operation performance which is the target is not satisfied (NO), the computer apparatus 50 returns to the processing of step S52. The processing of step S60 may be automatically performed by the computer apparatus 50 based on the operation performance which is the target stored in advance, or the designer may perform the processing based on the display of the display 60. According to the above-described processing, in order to satisfy the operation performance which is the target of the mechanical apparatus 10, the designer can easily ascertain the design of which improvement-required item may be changed to what extent.

As described above, according to the supporting apparatus 40 and the supporting method which uses the supporting apparatus 40 that are described in the example, the designer can easily ascertain the item to be improved in the design of the mechanical apparatus 10, or the effect by the improvement, and can perform the design change which has the effect of the mechanical apparatus 10 during a short period of time.

For example, each step performed by the supporting apparatus 40 of the example, for example, the step of specifying the improvement-required item from the determined mechanical properties (step S16 of FIG. 2) may be performed by the designer.

The technical elements described in the present description or drawings achieve technical usefulness independently or being combined with each other, and are not limited the combination described in the claims of the application. In addition, the technology illustrated in the present description or the drawings as an example achieves plural objects at the same time, and has the technical usefulness by achieving one object among the plural objects.

REFERENCE SIGNS LIST

10: MECHANICAL APPARATUS
12: MOTOR
14: DECELERATOR
16: GUIDE RAIL
18: MOVABLE BODY
20: FEED SCREW
22: ENCODER
24: SERVO AMPLIFIER
40: SUPPORTING APPARATUS
50: COMPUTER APPARATUS
52: ITEM SPECIFYING SECTION
54: PROPERTIES MAKING SECTION
56: SIMULATION SECTION
58: EFFECT CALCULATING SECTION
60: DISPLAY
70: USER INTERFACE

The invention claimed is:

1. A method for supporting work of improving the design of a mechanical apparatus which is operated by a motor, comprising:
    an operating step of operating a movable section of the mechanical apparatus by the motor;
    a measuring step of obtaining at least one index which indicates an input into the motor or an output from the motor in the operating step;
    a determining step of determining the mechanical properties of the mechanical apparatus, by using at least one index obtained in the measuring step; and
    a specifying step of specifying at least one improvement-required item which is required to be improved in the design of the mechanical apparatus, by using the mechanical properties determined in the determining step,
    wherein the operating step includes:
        performing an oscillation motion of the movable section,
        performing a uniform motion of the movable section under a plurality of velocity conditions, and
        performing an acceleration/deceleration motion of the movable section,
    wherein the measuring step includes:
        obtaining an input index which indicates an input into the motor over time, and an output index which indicates an output from the motor over time based on the performed oscillation motion of the movable section,
        obtaining a position index which indicates a rotation position of the motor over time in each velocity condition, a first velocity index which indicates a rotational velocity of the motor in each velocity condition, and a first torque index which indicates torque of the motor over time in each velocity condition based on the performed uniform motion of the movable section under a plurality of velocity conditions, and
        obtaining a second torque index which indicates the torque of the motor in the acceleration/deceleration motion over time, and a second velocity index which indicates the rotational velocity of the motor over time based on the performed acceleration/deceleration motion of the movable section,
    wherein the determining step includes:
        determining frequency properties of the output with respect to the input into the motor using the input index and the output index,
        determining position-torque properties which illustrate a relationship between the rotational position and the torque of the motor using the position index and the first torque index for each velocity condition,
        determining velocity-torque properties which illustrate a relationship between the rotational velocity and the torque of the motor using the first velocity index and the first torque index for each velocity condition, and
        determining a correction torque index excluding influence of friction from the second torque index using the second torque index, the second velocity index, and the velocity-torque properties, and
    wherein the specifying step includes at least one of:
        specifying rigidity of the mechanical apparatus as the improvement-required item using the frequency properties, specifying a tooth contact of a gear connected to the motor or cogging torque of the motor as the improvement-required item using the position-torque properties, specifying friction according to the motion of the movable section as the improvement-required item using the velocity-torque properties, or specifying inertia of the movable portion as the improvement-required item using the correction torque index.

2. The method according to claim 1,
wherein a frequency component of the input index and a frequency component of the output index are respectively calculated, and by using the frequency component of the input index and the frequency component of the output index, the frequency properties are determined in the determining step.

3. The method according to claim 1,
wherein the input index is a current index which indicates the current of the motor over time, and
wherein the output index is a position index which indicates a rotation position of the motor over time.

4. The method according to claim 1,
wherein the rigidity of the mechanical apparatus is specified as the improvement-required item based on at least one of a resonance frequency which takes the maximum value in the frequency properties or an anti-resonance frequency which takes the minimum value.

5. The method according to claim 4,
wherein a mass ratio of the movable section is calculated by using the resonance frequency and the anti-resonance frequency, and a part at which the rigidity is not sufficient is specified in the movable section by using the mass ratio, in the specifying step.

6. The method according to claim 4,
wherein the rigidity of a member which extends along the moving direction of the movable portion is specified to be not sufficient, in a case where at least one of the resonance frequency and the anti-resonance frequency changes in accordance with positions of the movable portion, in the specifying step.

7. The method according to claim 1,
wherein the frequency component of the position-torque properties is calculated, and the tooth contact of the gear connected to the motor or the cogging torque of the motor is specified as the improvement-required item based on the frequency component, in the specifying step.

8. The method according to claim 1, further comprising:
a performance calculation step of calculating operation performance after a design change of the mechanical apparatus, by making mechanical properties of the mechanical apparatus after the design change, and performing a simulation using the mechanical properties, on the assumption that the design of at least one improvement-required item specified in the specifying step is changed.

9. The method according to claim 8, further comprising:
an effect calculation step of calculating a performance difference of the mechanical apparatus before and after the design change, by using the operation performance after the design change calculated in the performance calculation step.

10. An apparatus which supports work of improving the design of mechanical apparatus which is operated by a motor, comprising:

circuitry configured to perform:
an operating step of operating a movable section of the mechanical apparatus by the motor,
a measuring step of obtaining at least one index which indicates an input into the motor or an output from the motor in the operating step,
a determining step of determining the mechanical properties of the mechanical apparatus, by using at least one index obtained in the measuring step, and
a specifying step of specifying at least one improvement-required item which is required to be improved in the design of the mechanical apparatus, by using the mechanical properties determined in the determining step, wherein the operating step includes:
performing an oscillation motion of the movable section,
performing a uniform motion of the movable section under a plurality of velocity conditions, and
performing an acceleration/deceleration motion of the movable section, wherein the measuring step includes:
obtaining an input index which indicates an input into the motor over time, and an output index which indicates an output from the motor over time based on the performed oscillation motion of the movable section,
obtaining a position index which indicates a rotation position of the motor over time in each velocity condition, a first velocity index which indicates a rotational velocity of the motor in each velocity condition, and a first torque index which indicates torque of the motor over time in each velocity condition based on the performed uniform motion of the movable section under a plurality of velocity conditions, and
obtaining a second torque index which indicates the torque of the motor in the acceleration/deceleration motion over time, and a second velocity index which indicates the rotational velocity of the motor over time based on the performed acceleration/deceleration motion of the movable section, wherein the determining step includes:
determining frequency properties of the output with respect to the input into the motor using the input index and the output index,
determining position-torque properties which illustrate a relationship between the rotational position and the torque of the motor using the position index and the first torque index for each velocity condition,
determining velocity-torque properties which illustrate a relationship between the rotational velocity and the torque of the motor using the first velocity index and the first torque index for each velocity condition, and
determining a correction torque index excluding influence of friction from the second torque index using the second torque index, the second velocity index, and the velocity-torque properties, and wherein the specifying step includes at least one of:
specifying rigidity of the mechanical apparatus as the improvement-required item using the frequency properties,
specifying a tooth contact of a gear connected to the motor or cogging torque of the motor as the improvement-required item using the position-torque properties, specifying friction according to the motion of the movable section as the improvement-required item using the velocity-torque properties, or specifying inertia of the movable portion as the improvement-required item using the correction torque index.

11. The method according to claim 1, wherein the mechanical apparatus includes guide rail which supports the movable section, and a feed screw which coverts rotation motion of the motor to rectilinear motion of the movable section.

12. The apparatus according to claim 10, wherein the mechanical apparatus includes guide rail which supports the movable section, and a feed screw which coverts rotation motion of the motor to rectilinear motion of the movable section.

* * * * *

UNITED STATES PATENT AND TRADEMARK OFFICE
CERTIFICATE OF CORRECTION

PATENT NO.        : 10,216,891 B2
APPLICATION NO.   : 15/035403
DATED             : February 26, 2019
INVENTOR(S)       : Makoto Kainuma et al.

Page 1 of 1

It is certified that error appears in the above-identified patent and that said Letters Patent is hereby corrected as shown below:

On the Title Page

Item (71), the Applicant's information is incorrect. Item (71) should read:
-- (71) Applicant: FUJI CORPORATION, Chiryu (JP) --

Signed and Sealed this
Twenty-eighth Day of April, 2020

Andrei Iancu
*Director of the United States Patent and Trademark Office*